United States Patent
Sakurai et al.

(10) Patent No.: US 7,952,930 B2
(45) Date of Patent: May 31, 2011

(54) NAND FLASH MEMORY

(75) Inventors: Kiyofumi Sakurai, Yokohama (JP); Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 12/497,153

(22) Filed: Jul. 2, 2009

(65) Prior Publication Data

US 2010/0014350 A1    Jan. 21, 2010

(30) Foreign Application Priority Data

Jul. 15, 2008  (JP) ................... 2008-184056

(51) Int. Cl.
*G11C 11/34* (2006.01)
*G11C 16/04* (2006.01)
(52) U.S. Cl. ....................... 365/185.17; 365/185.11
(58) Field of Classification Search ............. 365/185.17, 365/185.11, 185.23, 185.03
See application file for complete search history.

(56) References Cited

U.S. PATENT DOCUMENTS

| | | | | |
|---|---|---|---|---|
| 5,568,420 | A * | 10/1996 | Lim et al. ................. | 365/185.17 |
| 6,798,683 | B2 * | 9/2004 | Hosono et al. ................. | 365/63 |
| 7,057,915 | B2 | 6/2006 | Futatsuyama | |
| 7,177,173 | B2 | 2/2007 | Futatsuyama | |
| 7,245,534 | B2 * | 7/2007 | Goda et al. ................. | 365/185.17 |
| 7,313,009 | B2 | 12/2007 | Futatsuyama | |
| 7,755,944 | B2 * | 7/2010 | Hwang et al. ............ | 365/185.11 |
| 2006/0197136 | A1 | 9/2006 | Futatsuyama et al. | |

FOREIGN PATENT DOCUMENTS

| JP | 7-230696 | 8/1995 |
|---|---|---|
| JP | 2000-76880 | 3/2000 |
| JP | 2002-141477 | 5/2002 |
| JP | 2005-39016 | 2/2005 |
| JP | 2005-191413 | 7/2005 |
| JP | 3834189 | 7/2006 |

* cited by examiner

*Primary Examiner* — Anh Phung
(74) *Attorney, Agent, or Firm* — Oblon, Spivak, McClelland, Maier & Neustadt, L.L.P.

(57) ABSTRACT

A NAND flash memory according to examples of the invention includes a memory cell array comprised of first, second, and third NAND blocks disposed in order in a first direction and first and second transfer transistor blocks disposed in order in the first direction at one end in a second direction intersecting with the first direction of the memory cell array. An address allocation to the word lines in the first NAND block is inverted against an address allocation to the word lines in the third NAND block.

20 Claims, 9 Drawing Sheets

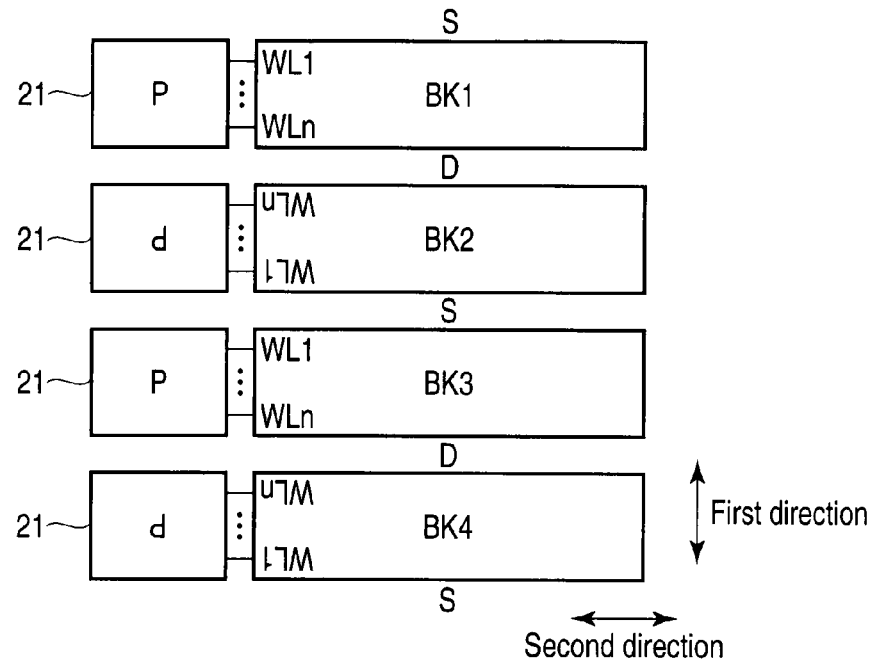
F I G. 3
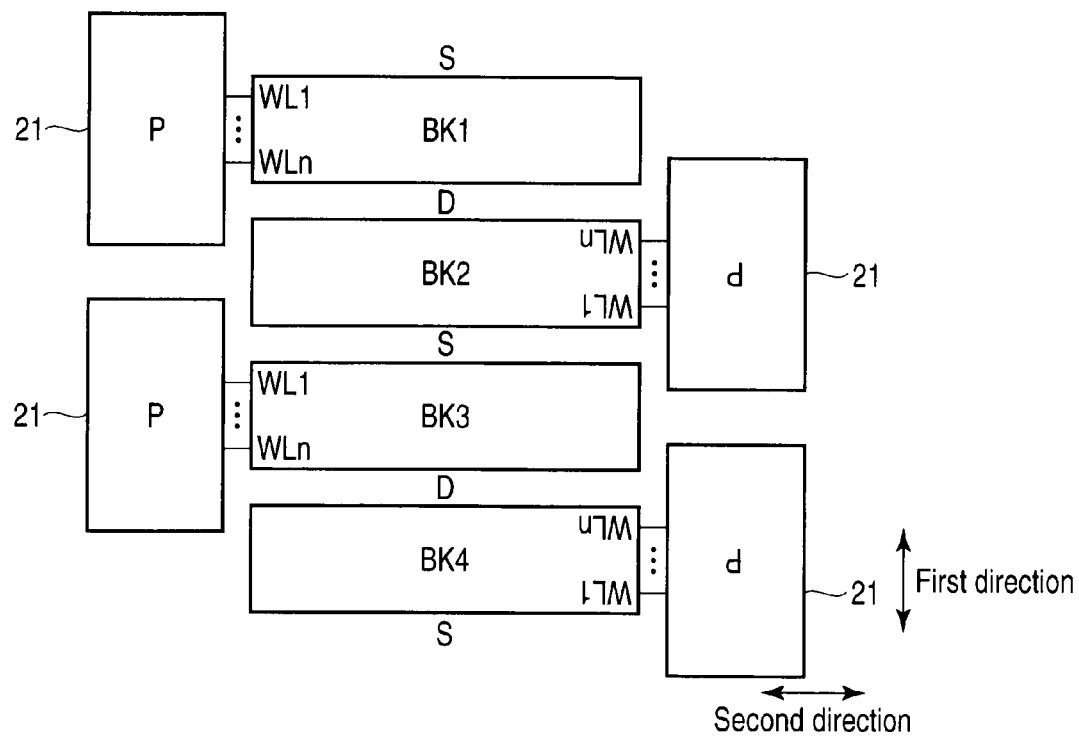
F I G. 5

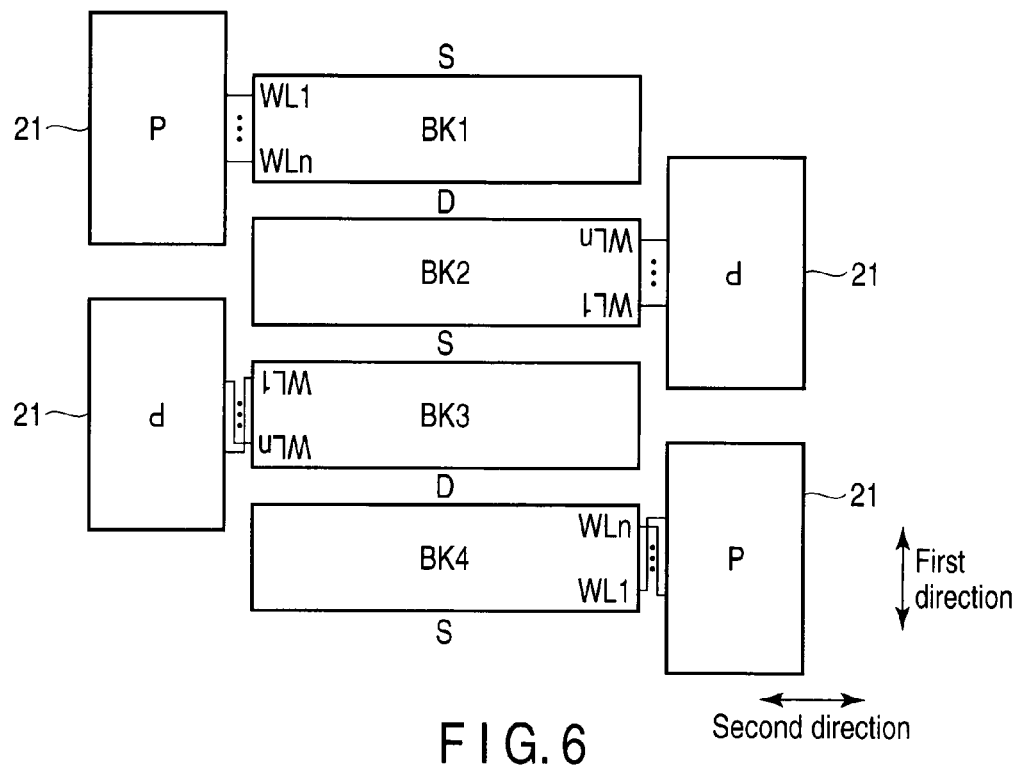
F I G. 6
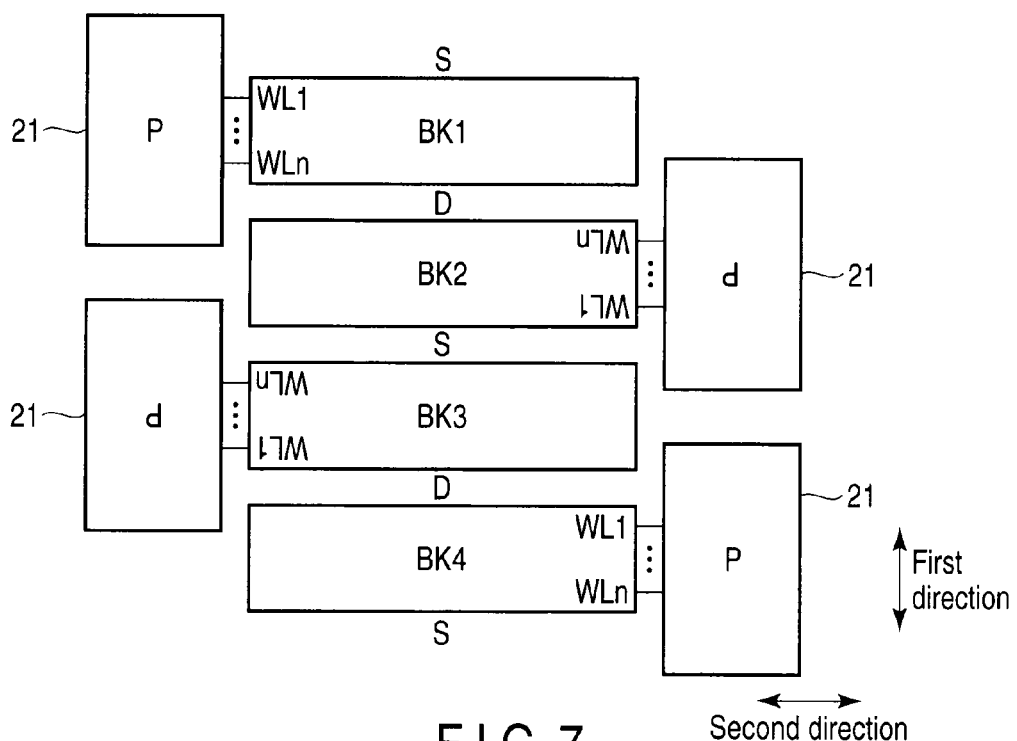
F I G. 7

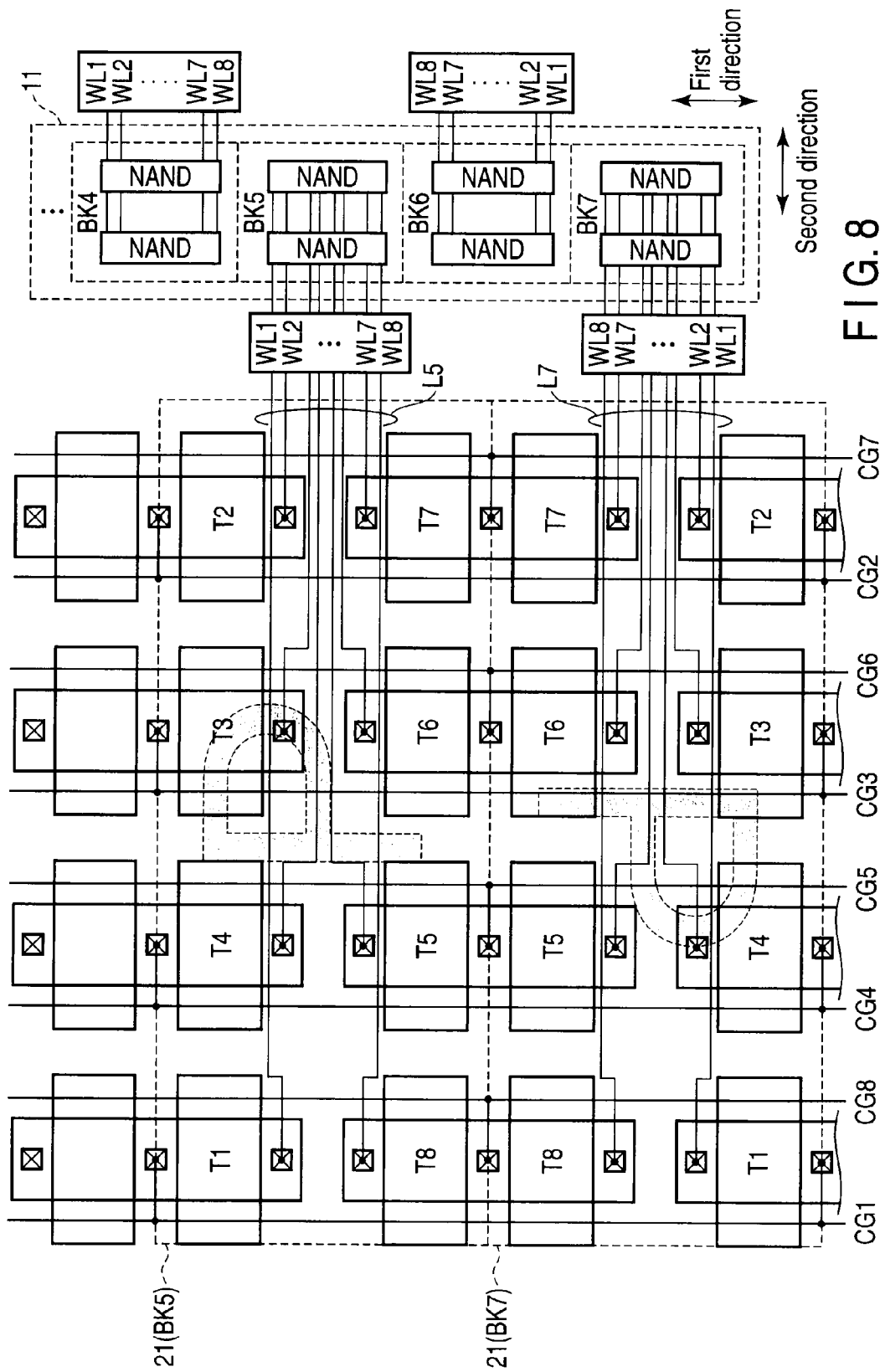
F I G. 8

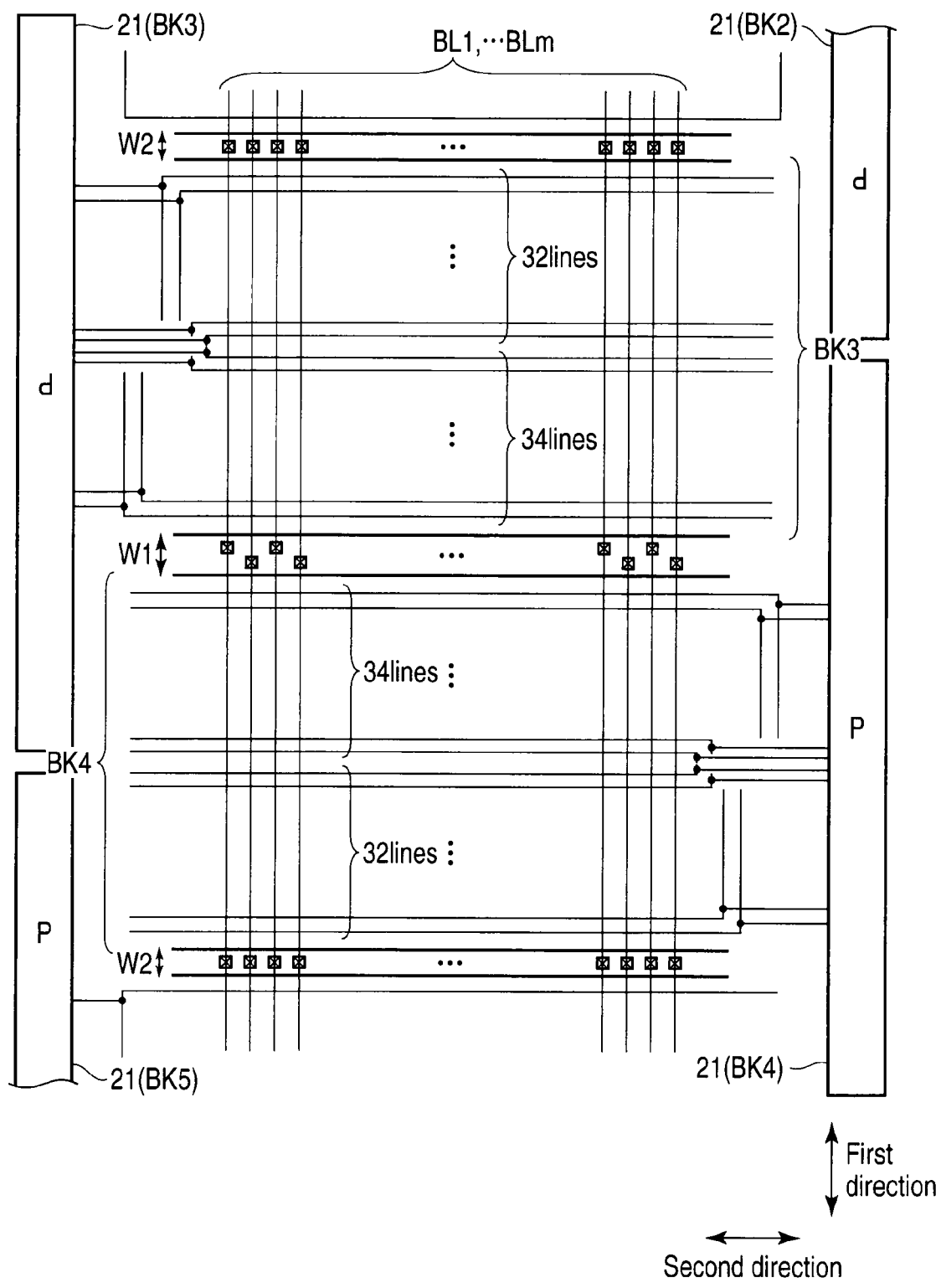
F I G. 1 2

NAND FLASH MEMORY

CROSS-REFERENCE TO RELATED APPLICATIONS

This application is based upon and claims the benefit of priority from prior Japanese Patent Application No. 2008-184056, filed Jul. 15, 2008, the entire contents of which are incorporated herein by reference.

BACKGROUND OF THE INVENTION

1. Field of the Invention

The present invention relates to address allocation to word lines of a NAND flash memory.

2. Description of the Related Art

A NAND flash memory is used as a file memory and a mobile memory. In addition, recently, the NAND flash memory is used as a solid-state drive (SSD) which is a substitute for an HDD of a notebook computer. Here, the file memory is a NAND flash memory when it is incorporated alone in, for example, a memory card, a USB, and digital equipment. The mobile memory is a NAND flash memory when plural kinds of memories (such as a NOR flash memory) are combined and used, such as a multi-chip package (MCP) mounted in a cellular telephone.

In the above situations, a memory cell must be miniaturized for the purpose of increasing the memory capacity of the NAND flash memory.

However, while the size of the memory cell is reduced (shrunk), the size of a transfer transistor in a word line driver is limited by the magnitude of a write voltage, which is supplied to the word line during writing, and therefore, the size of the transfer transistor cannot be reduced, unlike the memory cell.

Therefore, at present, a transfer transistor block is comprised in such a manner that transfer transistors are arranged in an array form at one end of a memory cell array, and the word lines in one NAND block and the transfer transistor block are connected to each other through electroconductive lines (hereinafter referred to as interconnect lines) (for example, see Jpn. Pat. Appln. KOKAI Publication Nos. 7-230696, 2000-76880, 2002-141477, 2005-191413, 2005-39016, and Japanese Patent No. 3834189).

Here it is important that the layout of the transfer transistor block and the layout of the interconnect lines play a significant role in reducing the size of a chip.

Namely, those layouts have a simple repeated pattern thereby to contribute to the reduction of the chip size.

BRIEF SUMMARY OF THE INVENTION

A NAND flash memory according to an aspect of the present invention comprises a memory cell array comprised of first, second, and third NAND blocks disposed in order in a first direction, first and second transfer transistor blocks disposed in order in the first direction at one end in a second direction intersecting with the first direction of the memory cell array, word lines disposed in the first NAND block and connected to the first transfer transistor block, and word lines disposed in the third NAND block and connected to the second transfer transistor block. An address allocation to the word lines in the first NAND bock is inverted against an address allocation to the word lines in the third NAND bock.

BRIEF DESCRIPTION OF THE SEVERAL VIEWS OF THE DRAWING

FIG. 3 is a view showing a layout of the first comparative example;
FIG. 5 is a view showing a layout of the second comparative example;
FIG. 6 is a view showing a layout of a third comparative example;
FIG. 7 is a view showing a layout of an embodiment;
FIG. 8 is a view showing a layout of an embodiment;
FIG. 12 is a view showing an example of a memory cell array configuration.

DETAILED DESCRIPTION OF THE INVENTION

A NAND flash memory of an aspect of the present invention will be described below in detail with reference to the accompanying drawings.

1. Outline

In the examples of the invention, a layout in which transfer transistor blocks are disposed on both sides of a memory cell array (hereinafter referred to as a both-side layout) is used. Namely, the transfer transistor block corresponding to an odd-numbered NAND block is disposed on one end side of the memory cell array, and the transfer transistor block corresponding to an even-numbered NAND block is disposed on the other end side of the memory cell array.

Here, for the transfer transistor blocks disposed on one end side of the memory cell array, it is preferable for simplification of interconnection and accompanying reduction of a chip size that the two adjacent transfer transistor blocks and the interconnect lines connected thereto are symmetrically disposed (mirror inversion).

However, when it is attempted to secure the above symmetry by using the both-side layout, if the conventional address allocation is used as it is, interconnection is further complicated because of the relationship with the memory cell array configuration.

Namely, NAND blocks share source and drain, and therefore, the positional relationship between the source and the drain is inverted between odd-numbered NAND blocks and even-numbered NAND blocks. For example, all the odd-numbered NAND blocks have the same positional relationship between the source and the drain.

In the above case, for example, when the word lines in the first and third NAND blocks and two transfer transistor blocks symmetrically disposed on one end side of the memory cell array are interconnected, the same address allocation is applied to the word lines in the first and third NAND blocks, and therefore, the word lines in the first NAND block and the word lines in the third NAND block are asymmetric. Namely, interconnection must be performed by replacing the physical positions of the word lines in one of these two NAND blocks. Interconnection is complicated because of the replacement operation.

In an example of the invention, in order to prevent the above problem, the address allocation to the word lines in the third NAND block is made to be inverted against the address allocation to the word lines in the first NAND block. According to this constitution, even if the physical positions of the word lines in one of the two NAND blocks are not replaced, the word lines in the two NAND blocks are symmetrically disposed, leading to ease of interconnection for the two transistor blocks symmetrically disposed on one end side of the memory cell array.

2. Embodiments

Embodiments of the NAND flash memory according to the invention will be described.

(1) Overall View

Figure 1:
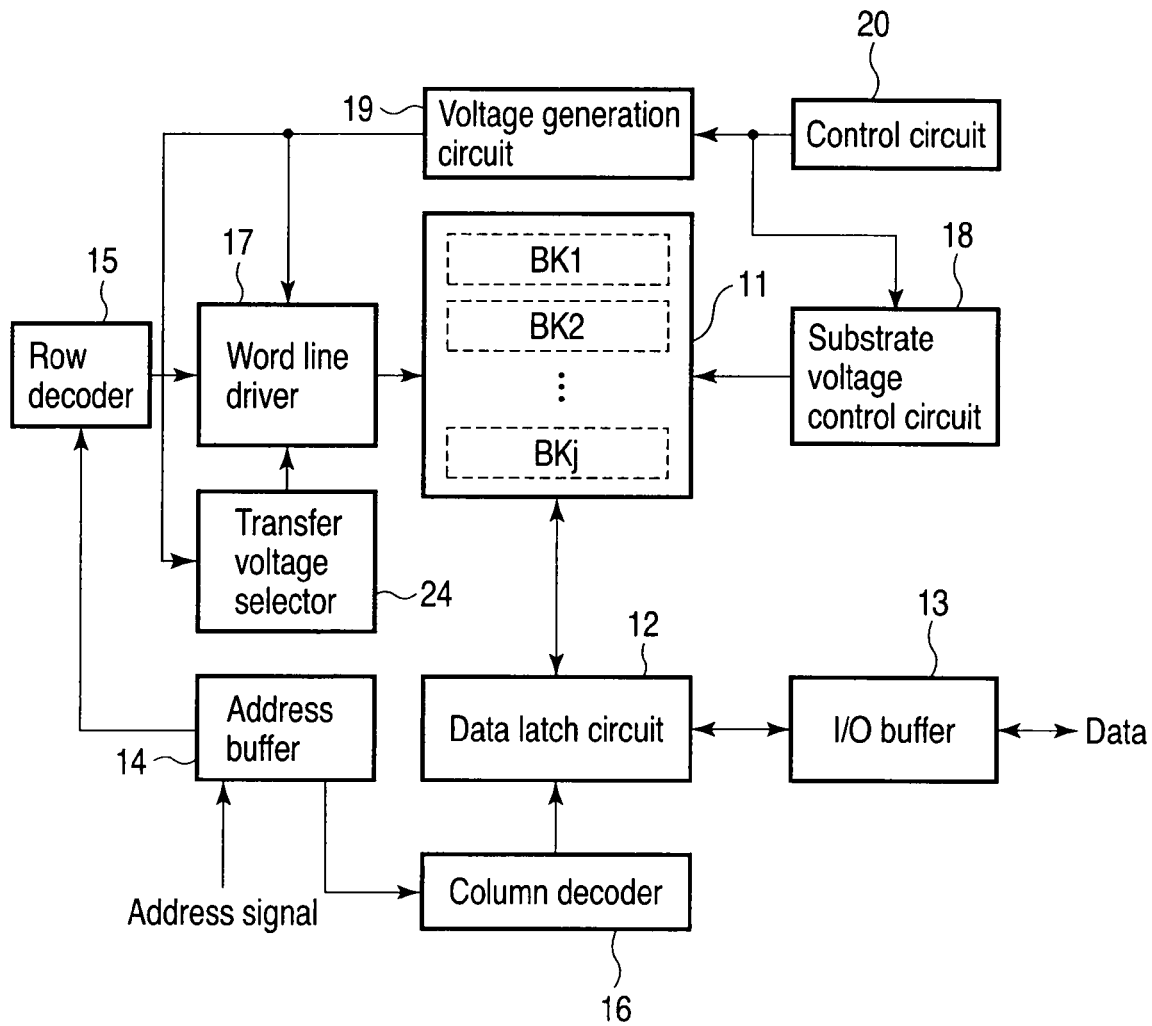
FIG. 1 is a view showing a NAND flash memory.

FIG. 1 is an overall view of a NAND flash memory.

A memory cell array 11 is comprised of NAND blocks BK1 to BLj. Each of the NAND blocks BK1 to BLj has cell units. Each of the cell units is comprised of a NAND string including series-connected memory cells and two select gate transistors respectively connected to each of the both ends.

A data latch circuit 12 has a function of temporarily latching data when reading and writing the data, and is comprised of, for example, a flip-flop circuit. An I/O (input/output) buffer 13 operates as an interface circuit for data. An address buffer 14 operates as an interface circuit for an address signal.

The address signal includes a block address signal, a row address signal, and a column address signal.

A row decoder 15 selects one of the NAND blocks BK1 to BLj based on the block address signal, and further selects one of the word lines in the selected block based on the row address. A word line driver 17 drives the word lines in the selected block.

A column decoder 16 selects one of bit lines based on the column address signal.

A substrate voltage control circuit 18 controls the voltage of a semiconductor substrate. Specifically, when a double well region including an n-type well region and a p-type well region is formed in a p-type semiconductor substrate, and a memory cell is formed in the p-type well region, the voltage in the p-type well region is controlled in response to an operating mode.

For example, the substrate voltage control circuit 18 sets the voltage in the p-type well region to 0 V when reading and writing, and sets the voltage in the p-type well region to not less than 15 V and not more than 45 V when erasing.

A voltage generation circuit 19 generates a voltage for controlling the word line driver 17 and a transfer voltage to be supplied to the word lines in the selected block.

A transfer voltage selector 24 selects a value of the voltage, supplied to each of the word lines in the selected block, based on information such as the operating mode and the position of the selected word lines.

For example, when writing, a write voltage is supplied to the selected word lines in the selected block. At this time, a transfer voltage lower than the write voltage is supplied to non-selected word lines in the selected block.

Meanwhile, when reading, a read voltage is supplied to the selected word lines in the selected block. At this time, a transfer voltage higher than the read voltage is supplied to non-selected word lines in the selected block.

A control circuit 20 controls the operation of the substrate voltage control circuit 18 and the voltage generation circuit 19.

(2) First Comparative Example

Figure 2:
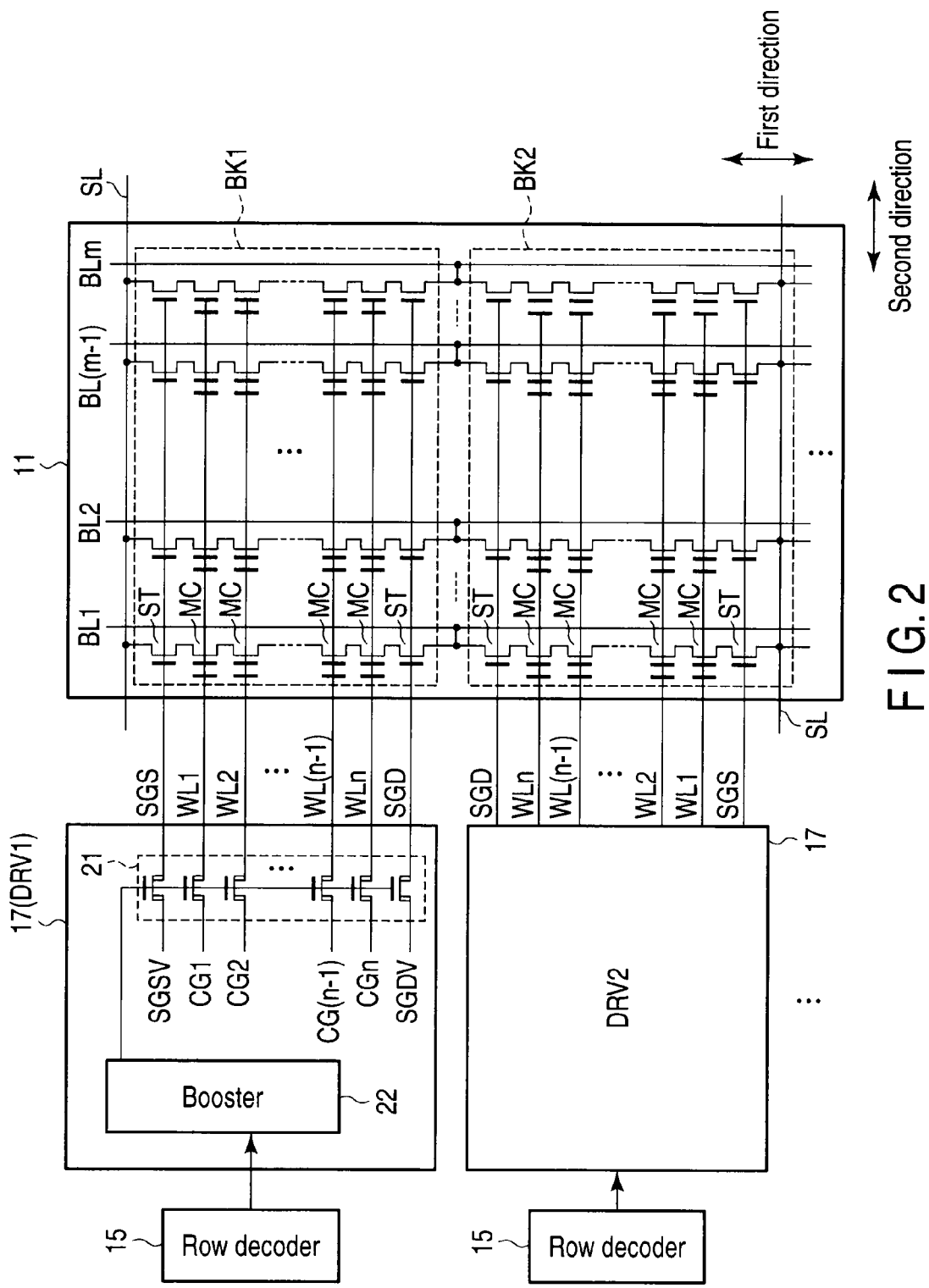
FIG. 2 is a view showing a word line driver of a first comparative example.

FIG. 2 shows the memory cell array and the word line driver in the NAND flash memory.

The NAND flash memory of FIG. 2 has such a layout that a transfer transistor block 21 is disposed on only one side of the memory cell array 11 (hereinafter referred to as a one-side layout).

The memory cell array 11 is comprised of the NAND blocks BK1, BK2, . . . disposed in a first direction.

Each of the NAND blocks has cell units disposed in a second direction. Each of the cell units is comprised of a NAND string including series-connected memory cells MC and two select gate transistors ST respectively connected to each of the both ends.

One end of the cell unit is connected to bit lines BL1 to BLm, and the other end is connected to a source line SL.

The word lines WL1 to WLn and select gate lines SGS and SGD are disposed on the memory cell array 11.

For example, n (n is greater than one) word lines WL1 to WLn and the two select gate lines SGS and SGD are disposed in the NAND block BK1. The word lines WL1 to WLn and the select gate lines SGS and SGD extend in the second direction and are connected respectively to signal lines (control gate lines) CG1 to CGn and signal lines SGSV and SGDV through the transfer transistor block 21 in the word line driver 17 (DRV1).

The signal lines CG1 to CGn, SGSV, and SGDV extend in the first direction intersecting with the second direction and are connected to the transfer voltage selector 24 of FIG. 1.

The transfer transistor block 21 is comprised of a high-voltage MISFET so that a higher transfer voltage than a power voltage Vcc can be transferred.

A booster 22 in the word line driver 17 (DRV1) receives a decode signal output from the row decoder 15. When the NAND block BK1 is selected, the booster 22 turns on the transfer transistors in the transfer transistor block 21. When the NAND block BK1 is not selected, the booster 22 turns off the transfer transistors in the transfer transistor block 21.

FIG. 3 shows the layout of the transfer transistor block and the address allocation in the one-side layout of FIG. 2.

In FIG. 3, the layout of the transfer transistor block 21 includes the layout of the interconnect lines through which the transfer transistor block 21 and the word lines WL1 to WLn in the NAND blocks BK1 to BK4 are connected to each other.

The NAND blocks BK1 to BK4 are disposed in order in the first direction. The area between the NAND blocks BK1 and BK2 and the area between the NAND blocks BK3 and BK4 are a drain D. The area between the NAND blocks BK2 and BK3 is a source S.

The layout of the transfer transistor block 21 corresponding to the NAND block BK1 is symmetric to the layout of the transfer transistor block 21 corresponding to the NAND block BK2. In FIG. 3, the symmetry is expressed by the direction of "P".

Likewise, the layout of the transfer transistor block 21 corresponding to the NAND block BK2 is symmetric to the layout of the transfer transistor block 21 corresponding to the NAND block BK3. The layout of the transfer transistor block 21 corresponding to the NAND block BK3 is symmetric to the layout of the transfer transistor block 21 corresponding to the NAND block BK4.

The address allocations to the word lines WL1 to WLn in the NAND blocks BK1 to BK4 are the same. Namely, the address is allocated to the word lines WL1 to WLn so that the address sequentially increases from the word lines on the source S side to the word lines on the drain D side.

In this example, in one NAND block, WL1 represents the least significant bit (LSB) address, and WLn represents an most significant bit (MSB) address.

As described above, in the one-side layout, the two adjacent transfer transistor blocks 21 can be symmetrically disposed, and, at the same time, the physical positions of the two adjacent NAND blocks, for example, the physical positions of the word lines WL1 to WLn in the NAND blocks BK1 and BK2 also have symmetry.

Thus, interconnection between the word lines WL1 to WLn and the transfer transistor block 21 through the interconnect lines is simplified.

(3) Second Comparative Example

Figure 4:
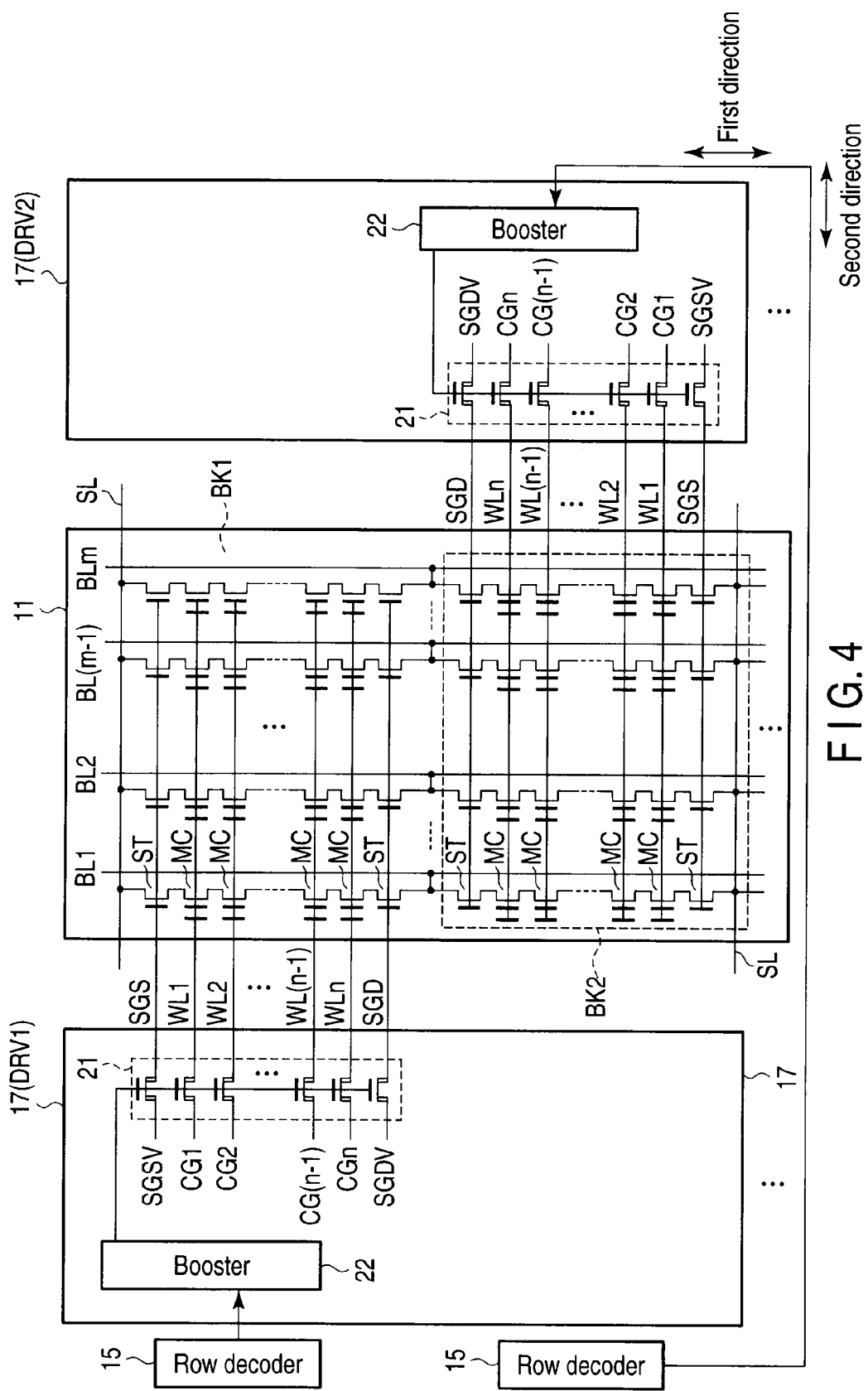
FIG. 4 is a view showing a word line driver of a second comparative example.

FIG. 4 shows the memory cell array and the word line driver in the NAND flash memory.

The NAND flash memory of FIG. 4 adopts the both-side layout in which the transfer transistor blocks 21 are disposed on both sides of the memory cell array 11.

The memory cells constituting one NAND string is increased in number, whereby the memory capacity of the NAND flash memory can be easily and usefully increased. However, the memory cells constituting one NAND string is increased in number, leading to increase in number of word lines in one NAND block.

In this example, one transfer transistor is connected to one word line. The size of the transfer transistor is influenced by the magnitudes of the write voltage and the transfer voltage transferred to the word lines, and is necessarily larger than the size of the memory cell. Therefore, in the one-side layout, even if the symmetry shown in FIG. 3 is secured, there is such a restriction that it is difficult to proximately dispose interconnects, having a different processing size, during exposure for interconnect formation, leading to such a problem that interconnection is further complicated by avoiding the restriction.

Thus, the both-side layout in which the transfer transistor block 21 is disposed on both sides of the memory cell array 11 is used, thereby contributing to the ease of interconnection.

The memory cell array 11 is comprised of the NAND blocks BK1, BK2, ... disposed in the first direction.

Each of the NAND blocks has the cell units disposed in the second direction. Each of the cell units is comprised of the NAND string including the series-connected memory cells MC and the two select gate transistors ST respectively connected to each of the both ends.

One end of the cell unit is connected to the bit lines BL1 to BLm, and the other end is connected to the source line SL.

The word lines WL1 to WLn and select gate lines SGS and SGD are disposed on the memory cell array 11.

The n (n is greater than one) word lines WL1 to WLn and the two select gate lines SGS and SGD are disposed in the NAND block BK1. The word lines WL1 to WLn and the select gate lines SGS and SGD extend in the second direction and are connected respectively to the signal lines (control gate lines) CG1 to CGn and the signal lines SGSV and SGDV through the transfer transistor block 21 in the word line driver 17 (DRV1).

Likewise, the n (n is greater than one) word lines WL1 to WLn and the two select gate lines SGS and SGD are disposed in the NAND block BK2. The word lines WL1 to WLn and the select gate lines SGS and SGD extend in the second direction and are connected respectively to the signal lines (control gate lines) CG1 to CGn and the signal lines SGSV and SGDV through the transfer transistor block 21 in the word line driver 17 (DRV2).

The signal lines CG1 to CGn, SGSV, and SGDV extend in the first direction intersecting with the second direction and are connected to the transfer voltage selector 24 of FIG. 1.

The transfer transistor block 21 is comprised of a high-voltage MISFET so that a higher transfer voltage than the power voltage Vcc can be transferred.

The booster 22 provided in each of the word line drivers 17 (DRV1 and DRV2) receives the decode signal output from the row decoder 15.

When the NAND block BK1 is selected, the booster 22 in the word line driver 17 (DRV1) turns on the transfer transistors in the transfer transistor block 21. When the NAND block BK1 is not selected, the booster 22 turns off the transfer transistors in the transfer transistor block 21.

Likewise, when the NAND block BK2 is selected, the booster 22 in the word line driver 17 (DRV2) turns on the transfer transistors in the transfer transistor block 21. When the NAND block BK2 is not selected, the booster 22 turns off the transfer transistors in the transfer transistor block 21.

FIG. 5 shows the layout of the transfer transistor block and the address allocation in the both-side layout of FIG. 4.

As in FIG. 3, the layout of the transfer transistor block 21 includes the layout of the interconnect lines through which the transfer transistor block 21 and the word lines WL1 to WLn in the NAND blocks BK1 to BK4 are connected to each other.

The NAND blocks BK1 to BK4 are disposed in order in the first direction. The area between the NAND blocks BK1 and BK2 and the area between the NAND blocks BK3 and BK4 are the drain D. The area between the NAND blocks BK2 and BK3 is the source S.

The transfer transistor blocks 21 corresponding to the NAND blocks BK1 and BK3 (odd-numbered NAND blocks) have the same layout. Further, the transfer transistor blocks 21 corresponding to the NAND blocks BK2 and BK4 (even-numbered NAND blocks) have the same layout. In FIG. 5, the sameness of the layouts is expressed by the direction of "P".

Further, the same address allocation is applied to the word lines WL1 to WLn in the NAND blocks BK1 to BK4. Namely, the address is allocated to the word lines WL1 to WLn so that the address sequentially increases from the word lines on the source S side to the word lines on the drain D side.

In this example, as in FIG. 3, in one NAND block, WL1 represents the LSB address, and WLn represents the MSB address.

As described above, in the both-side layout, the two adjacent transfer transistor blocks 21 on one end side of the memory cell array have the same layout, and, at the same time, the two adjacent transfer transistor blocks 21 on the other end side of the memory cell array have the same layout.

(4) Third Comparative Example

FIG. 6 shows the layout of the transfer transistor block and the address allocation in the both-side layout of FIG. 4.

As in FIG. 3, the layout of the transfer transistor block 21 includes the layout of the interconnect lines through which the transfer transistor block 21 and the word lines WL1 to WLn in the NAND blocks BK1 to BK4 are connected to each other.

The third comparative example is different from the second comparative example in that the layout of the transfer transistor block 21 corresponding to the NAND block BK3 is symmetric to the layout of the transfer transistor block 21 corresponding to the NAND block BK1, and the layout of the transfer transistor block 21 corresponding to the NAND block BK4 is symmetric to the layout of the transfer transistor block 21 corresponding to the NAND block BK2.

The third comparative example attempts to render interconnection easier by securing the symmetry of the two adjacent transfer transistor blocks 21 on one or the other end side of the memory cell array. However, the symmetry between the word lines WL1 to WLn in the NAND block BK1 and the word lines WL1 to WLn in the NAND block BK3 is lost. Further, the symmetry between the word lines WL1 to WLn in the NAND block BK2 and the word lines WL1 to WLn in the NAND block BK4 is lost.

Thus, in the third comparative example, although the symmetry between the two adjacent transfer transistor blocks 21 on one or the other end side of the memory cell array is secured, the asymmetry remains in the word lines WL1 to WLn. Therefore, the physical positions of the word lines WL1 to WLn in the NAND blocks BK3 and BK4 are required to be replaced, leading to the complexity of the pattern of the interconnect lines.

(5) Embodiments

FIG. 7 shows the layout of the transfer transistor block and the address allocation in the both-side layout of FIG. 4.

As in FIG. 3, the layout of the transfer transistor block 21 includes the layout of the interconnect lines through which the transfer transistor block 21 and the word lines WL1 to WLn in the NAND blocks BK1 to BK4 are connected to each other.

This embodiment is different from the third comparative example in that the address allocation to the word lines WL1 to WLn in the NAND block BK3 is inverted against the address allocation to the word lines WL1 to WLn in the NAND block BK1, and, at the same time, the address allocation to the word lines WL1 to WLn in the NAND block BK4 is inverted against the address allocation to the word lines WL1 to WLn in the NAND block BK2.

Namely, the address is allocated to the word lines WL1 to WLn in the NAND blocks BK1 and BK2 so that the address sequentially increases from the word lines on the source S side to the word lines on the drain D side. Meanwhile, the address is allocated to the word lines WL1 to WLn in the NAND blocks BK3 and BK4 so that the address sequentially increases from the word lines on the drain D side to the word lines on the source S side.

In this embodiment, as in FIG. 3, in one NAND block, WL1 represents the LSB address, and WLn represents the MSB address.

The address is allocated to the word lines in the above manner, whereby even if the symmetry of the transfer transistor block as in the third comparative example is adopted, the physical positions of the word lines WL1 to WLn in the NAND blocks BK3 and BK4 are not required to be replaced, and therefore, the pattern of the interconnect lines is fully simplified.

FIG. 8 embodies the layout of the transfer transistor of FIG. 7.

In this example, one NAND string is comprised of 8 memory cells. Namely, eight word lines WL1 to WL8 are disposed in one NAND block.

One transfer transistor block corresponding to one NAND block is comprised of eight transfer transistors T1 to T8. The eight transfer transistors T1 to T8 comprise an array with two rows in the first direction and four columns in the second direction (2×4).

The transfer transistors T1 to T8 in the transfer transistor block are connected between signal lines (control gate lines) CG1 to CG8 and interconnect lines L5 to L7.

For example, the transfer transistors T1 to T8 in the transfer transistor block 21 (BK5) are connected between the signal lines (control gate lines) CG1 to CG8 and the interconnect lines L5.

The transfer transistors T1 to T8 in the transfer transistor block 21 (BK7) are connected between the signal lines (control gate lines) CG1 to CG8 and the interconnect lines L7.

The layout of the transfer transistor block 21 (BK5) and the interconnect lines L5 is symmetric to the layout of the transfer transistor block 21 (BK7) and the interconnect lines L7 (mirror inversion).

The address allocation to the eight word lines WL1 to WL8 in the NAND block BK4 is inverted against the address allocation to the eight word lines WL1 to WL8 in the NAND block BK2.

Thus, the physical positions of the eight word lines WL1 to WL8 in the NAND block BK2 are inverted against the physical positions of the eight word lines WL1 to WL8 in the NAND block BK4 (mirror inversion).

According to the above constitution, the physical positions of the eight word lines WL1 to WL8 in the NAND block BK4 are not required to be replaced, and the layouts of the transfer transistor blocks 21 (BK2 and BK4) and the interconnect lines L2 and L4 are fully simplified, whereby the chip size is reduced.

Figure 9:
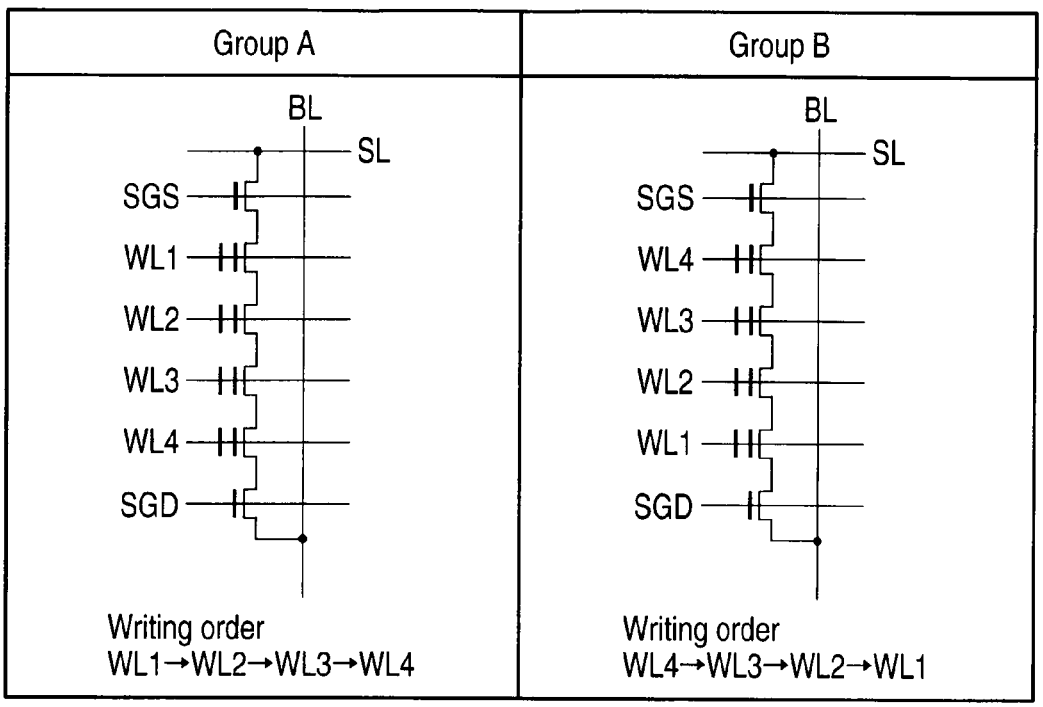
FIG. 9 is a view showing two types of address allocation.

In this embodiment, as shown in FIG. 9, there are two NAND blocks, one (group A) in which the address is allocated so as to sequentially increase from the word lines on the source S side to the word lines on the drain D side and the other (group B) in which the address is allocated so as to sequentially increase from the word lines on the drain D side to the word lines on the source S side.

In the above case, in the NAND block belonging to the group A, the writing order is WL1 (the LSB address)→WL2→WL3→WL4 (the MSB address). Meanwhile, in the NAND block belonging to the group B, the writing order is WL4 (the MSB address)→WL3→WL2→WL1 (the LSB address).

Figure 10:
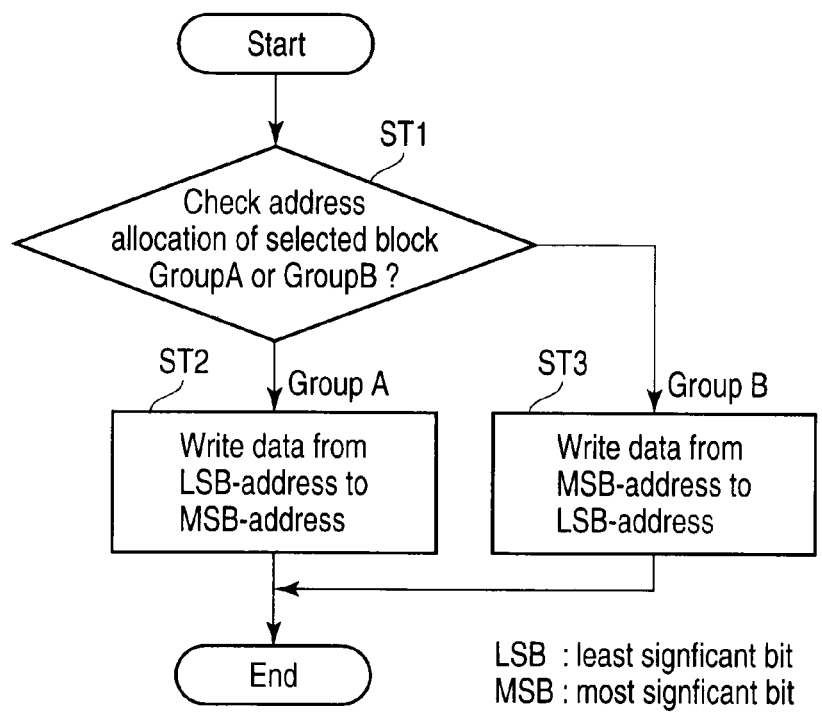
FIG. 10 is a view showing a control method during writing.

Thus, as shown in FIG. 10, during writing, whether the address allocation to the selected NAND block (selected block) belongs to the group A or the group B is first checked (step ST1).

When the NAND block belonging to the group A is selected, writing is executed from the LSB address (the memory cell closest to the source side) to the MSB address (the memory cell closest to the drain side) (step ST2).

When the NAND block belonging to the group B is selected, writing is executed from the MSB address (the memory cell closest to the source side) to the LSB address (the memory cell closest to the drain side) (step ST3).

As described above, in this embodiment, the two types of address allocations to the word lines in the NAND block are provided, whereby the writing order is changed according to the type of address allocation.

When the address allocation is changed, a voltage applied to the word lines must be set so that the voltage relationship in the writing is the same in the groups A and B. For example, when writing is applied to the third memory cell from the source side by local self-boost (LSB) writing, the word line WL3 is selected in the group A. Therefore, a write voltage is applied to the word line WL3, a cut-off voltage is applied to the word line WL2, and a transfer voltage is applied to the other word lines WL1 and WL4. Meanwhile, in the group B, since the word line WL2 is selected, the write voltage is applied to the word line WL2, the cut-off voltage is applied to the word line WL3, and the transfer voltage is applied to the other word lines WL1 and WL4.

(6) Summary

As described above, the layouts of the two adjacent transfer transistor blocks and the interconnect lines are symmetrically disposed, and the address allocations to the word lines in the two NAND blocks, corresponding to the two transfer transistor blocks, are set to be inverted, whereby interconnection can be fully simplified, contributing to the reduction of the chip size.

3. Relationship with Memory Cell Array Configuration

Recently, as a technique for forming a line and a space finer than the limit of the processing size by lithography, a sidewall patterning technique (a double patterning technique) is proposed.

In the sidewall patterning technique, a sidewall insulating film is formed on a sidewall of a line pattern formed by lithography, and a base is processed using the sidewall insulating film as a mask. The technique is applied to the processing of the word lines of the NAND flash memory.

Figure 11:
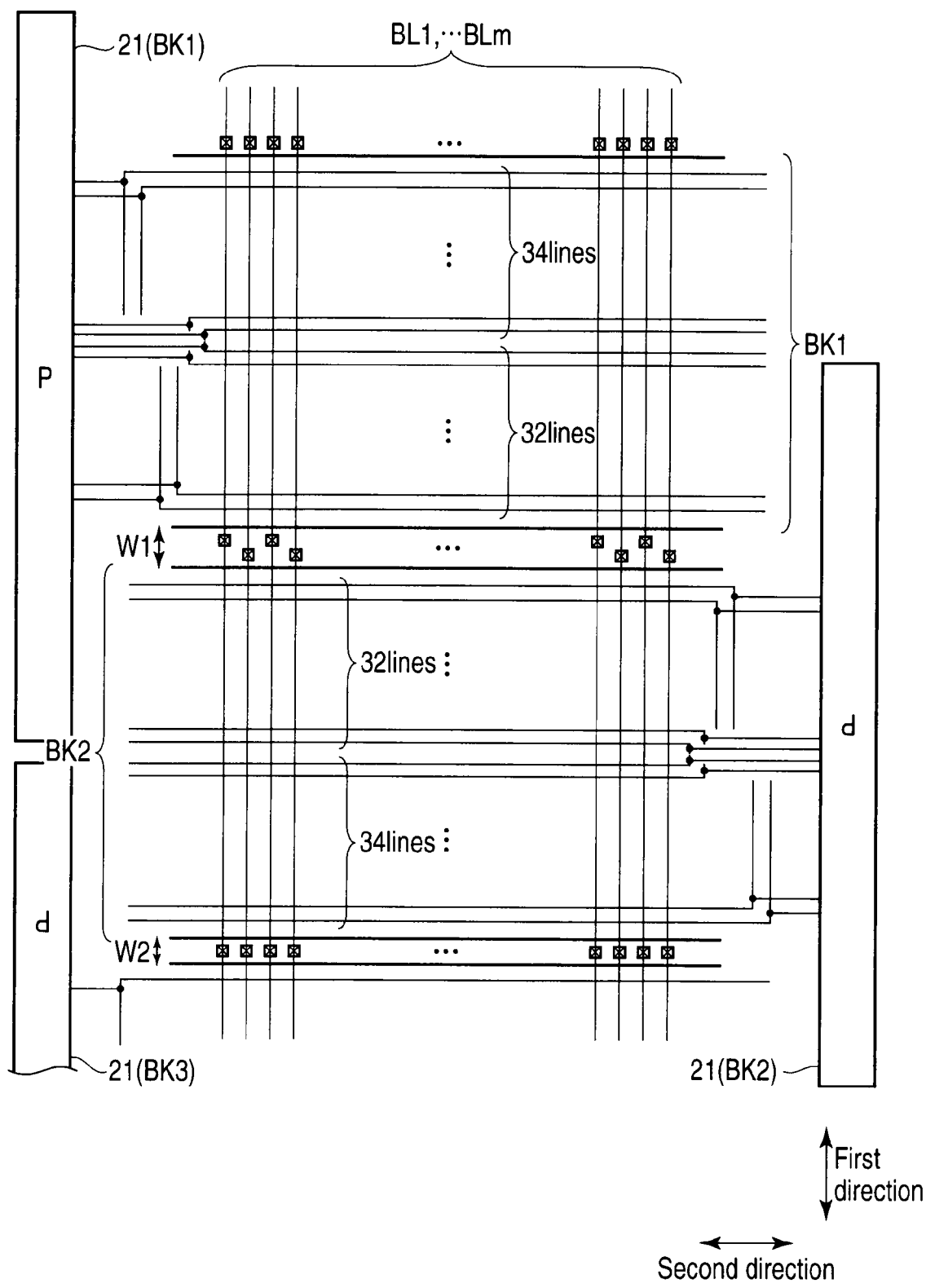
FIG. 11 is a view showing an example of a memory cell array configuration.

FIGS. 11 and 12 show the layout of the word lines in the NAND block formed by the sidewall patterning technique.

In FIGS. 11 and 12, 64 word lines and two dummy word lines are provided in one NAND block. In this case, 66 word lines (hereinafter including the dummy word lines) are required to be provided in one NAND block.

In this example, the 66 word lines in one NAND block is comprised of 32 word lines with a flexible end and 34 word lines with an end which is flexible in the opposite direction to the 32 word lines.

For example, in the NAND block BK1, the 66 word lines are comprised of 32 word lines, in which the ends on the side of the transfer transistor block 21 (BK1) are flexible upward in the drawings, and 34 word lines in which the ends on the side of the transfer transistor block 21 (BK1) are flexible downward in the drawings.

Namely, the word lines in one NAND block are comprised of n (n is an even number) word lines, which have flexible ends on the side of the transfer transistor block 21 connected to the word lines, and (n+2) word lines in which the ends on the side of the transfer transistor block 21 (BK1), connected to the word lines, are flexible in the opposite direction to the n word lines.

The area between the NAND blocks BK1 and BK2 and the area between the NAND blocks BK3 and BK4 respectively include bit line contact portions for the bit lines BL1 to BLm. The area between the NAND blocks BK2 and BK3 includes source line contact portions for the source line.

The width W1 in the first direction of the area including the bit line contact portions is larger than the width W2 in the first direction of the area including the source line contact portions. This is because while the source line can be shared, the bit line should be independently provided for each NAND string in one NAND block, and therefore, the bit line contact portions are disposed in a zigzag manner.

The invention can be applied to the above memory cell array configuration. Specifically, in the above memory cell array configuration, the layout of the interconnect lines is easily complicated because of the layout of the word lines in one NAND block and the structure of the bit line/source line contact portions. Thus, interconnection becomes easy by applying the invention, whereby it is very effective for the reduction of the chip size.

4. Others

The examples of the invention are not limited by the number of the memory cells constituting the NAND string. Further, the direction of the transfer transistor (MISFET) in the transfer transistor block is not limited to the above embodiments.

For example, in the example of FIG. 8, in the transfer transistor, a transfer route of the transfer voltage is provided in the first direction (channel length direction); however, instead, the transfer route of the transfer voltage may be provided in the second direction.

Further, the transfer transistor block may be comprised of a combination of MISFET in which the transfer route of the transfer voltage is provided in the first direction and MISFET in which the transfer route of the transfer voltage is provided in the second direction.

Furthermore, an interconnect layer on which the word lines are formed, an interconnect layer on which the signal lines (control gate lines) are formed, and an interconnect layer on which the interconnect lines are formed are preferably different from each other; however, it is not limited thereto.

For example, a portion or the entire interconnect layer on which the word lines are formed and a portion or the entire interconnect layer, on which the interconnect lines, through which the word lines and the signal lines are connected to each other, are formed, may be formed in the same interconnect layer.

Further, the memory cell of the NAND flash memory may be a two-level type which stores data of two levels, or may be a multi-level type which stores multi-level data of three or more levels.

5. Conclusion

According to the invention, the chip size is reduced by the layout of the transfer transistor block and the interconnect lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A NAND flash memory comprising:
a memory cell array comprised of first, second, and third NAND blocks disposed in order in a first direction;
first and second transfer transistor blocks disposed in order in the first direction at one end in a second direction intersecting with the first direction of the memory cell array;
word lines disposed in the first NAND block and connected to the first transfer transistor block; and
word lines disposed in the third NAND block and connected to the second transfer transistor block,
wherein an address allocation to the word lines in the first NAND bock is inverted against an address allocation to the word lines in the third NAND bock.

2. The memory according to claim 1, wherein the first transfer transistor block and interconnect lines which is connected between the first transfer transistor block and the word lines in the first NAND block, are disposed symmetrically to the second transfer transistor block and interconnect lines which is connected between the second transfer transistor block and the word lines in the third NAND block.

3. The memory according to claim 1, wherein the word lines in the first NAND block are comprised of n (n is an even number) word lines in which the ends on the first transfer transistor block side are bended, and (n+2) word lines in which the ends on the first transfer transistor block side are bended in the opposite direction to the direction in which the n word lines are bended.

4. The memory according to claim 1, further comprising:
a drain contact portion disposed between the first and second NAND blocks; and
a source contact portion disposed between the second and third NAND blocks,
wherein a width in the first direction of the drain contact portion is larger than a width in the first direction of the source contact portion.

5. The memory according to claim 1, wherein a program operation is executed from an LSB address to an MSB address when the first NAND block is selected, and the program operation is executed from the MSB address to the LSB address when the third NAND block is selected.

6. The memory according to claim 5, wherein the program operation is executed after confirmation of the address allocation to the word lines in the first NAND block when the first NAND block is selected.

7. The memory according to claim 5, wherein the program operation is executed after confirmation of the address allocation to the word lines in the third NAND block when the third NAND block is selected.

8. The memory according to claim 1, wherein each of the first and second transfer transistor blocks is comprised of transfer transistors arranged in a matrix.

9. The memory according to claim 8, wherein the transfer transistors in the first transfer transistor block are disposed symmetrically to the transfer transistors in the second transfer transistor block.

10. The memory according to claim 1, further comprising:
a third transfer transistor block disposed on the other end in the second direction of the memory cell array; and
word lines disposed in the second NAND block and connected to the third transfer transistor block.

11. The memory according to claim 10, wherein an address allocation to the word lines in the second NAND bock is inverted against the address allocation to the word lines in the first NAND bock.

12. The memory according to claim 10, wherein an address allocation to the word lines in the second NAND bock is the same as the address allocation to the word lines in the third NAND block.

13. The memory according to claim 10, wherein the third transfer transistor block and interconnect lines which is connected between the third transfer transistor block and the word lines in the second NAND block, are disposed symmetrically to the first transfer transistor block and interconnect lines which is connected between the first transfer transistor block and the word lines in the first NAND block.

14. The memory according to claim 10, wherein the third transfer transistor block and interconnect lines which is connected between the third transfer transistor block and the word lines in the second NAND block, are disposed in the same layout as the second transfer transistor block and interconnect lines which is connected between the second transfer transistor block and the word lines in the third NAND block.

15. The memory according to claim 1, wherein each of the first, second, and third NAND blocks has a series-connected memory cell and two select gate transistors respectively connected to each of the both ends of the series-connected memory cell.

16. The memory according to claim 15, wherein the word lines in the first NAND block are connected to the memory cells in the first NAND block.

17. The memory according to claim 15, wherein the word lines in the second NAND block are connected to the memory cells in the second NAND block.

18. The memory according to claim 15, wherein each of the memory cells stores data of two levels.

19. The memory according to claim 15, wherein each of the memory cells stores multi-level data of three or more levels.

20. The memory according to claim 1, wherein the word lines in the first NAND block are connected to control gate lines extending in the first direction through the first transfer transistor block, and the word lines in the third NAND block are connected to the control gate lines through the second transfer transistor block.

* * * * *